United States Patent
Cha et al.

(10) Patent No.: US 10,270,348 B2
(45) Date of Patent: Apr. 23, 2019

(54) SYNCHRONOUS SWITCHING REGULATOR CIRCUIT

(71) Applicant: Avago Technologies General IP (Singapore) Pte. Ltd., Singapore (SG)

(72) Inventors: Choong Yul Cha, Irvine, CA (US);
Dandan Li, San Diego, CA (US);
Hung-Ming Chien, Irvine, CA (US);
Long Bu, Foster City, CA (US);
Stephen C. Au, San Diego, CA (US)

(73) Assignee: Avago Technologies International Sales PTE. Limited, Singapore (SG)

( * ) Notice: Subject to any disclaimer, the term of this patent is extended or adjusted under 35 U.S.C. 154(b) by 50 days.

(21) Appl. No.: 15/782,753

(22) Filed: Oct. 12, 2017

(65) Prior Publication Data
US 2018/0241312 A1 Aug. 23, 2018

Related U.S. Application Data

(60) Provisional application No. 62/462,890, filed on Feb. 23, 2017.

(51) Int. Cl.
*H02M 3/158* (2006.01)
*H02M 3/28* (2006.01)
*H02M 3/137* (2006.01)
*H03L 7/08* (2006.01)
*H02M 1/00* (2006.01)

(52) U.S. Cl.
CPC ........ *H02M 3/1588* (2013.01); *H02M 3/137* (2013.01); *H02M 3/158* (2013.01); *H02M 3/28* (2013.01); *H03L 7/08* (2013.01); *H02M 2001/0045* (2013.01)

(58) Field of Classification Search
CPC ....... H02M 2001/0045; H02M 3/1588; H02M 3/137; H02M 3/28
See application file for complete search history.

(56) References Cited

U.S. PATENT DOCUMENTS

| | | | | |
|---|---|---|---|---|
| 2004/0027099 A1* | 2/2004 | Fujii | ........................ | G06F 1/263 323/234 |
| 2006/0014510 A1* | 1/2006 | Yamamoto | ............... | H03J 1/005 455/260 |
| 2009/0021228 A1* | 1/2009 | Carr | ........................ | H02M 3/156 323/266 |
| 2009/0033298 A1* | 2/2009 | Kleveland | ............... | G05F 1/575 323/271 |
| 2013/0119957 A1* | 5/2013 | Kung | ................... | H02M 3/1582 323/299 |
| 2013/0176008 A1* | 7/2013 | Li | ........................... | H02M 1/36 323/273 |

* cited by examiner

*Primary Examiner* — Jue Zhang
*Assistant Examiner* — Lakaisha Jackson
(74) *Attorney, Agent, or Firm* — Morgan, Lewis & Bockius LLP

(57) ABSTRACT

A synchronous switching regulator circuit for supply regulation of a switching circuit includes a pass transistor to couple the switching circuit to a supply voltage. The synchronous switching regulator circuit further includes a switch that is operable to synchronously turn off a flow of a supply current through the pass transistor. The switching circuit can be controlled by a switching signal, and the switch can operate in synchronization with the switching circuit.

20 Claims, 4 Drawing Sheets

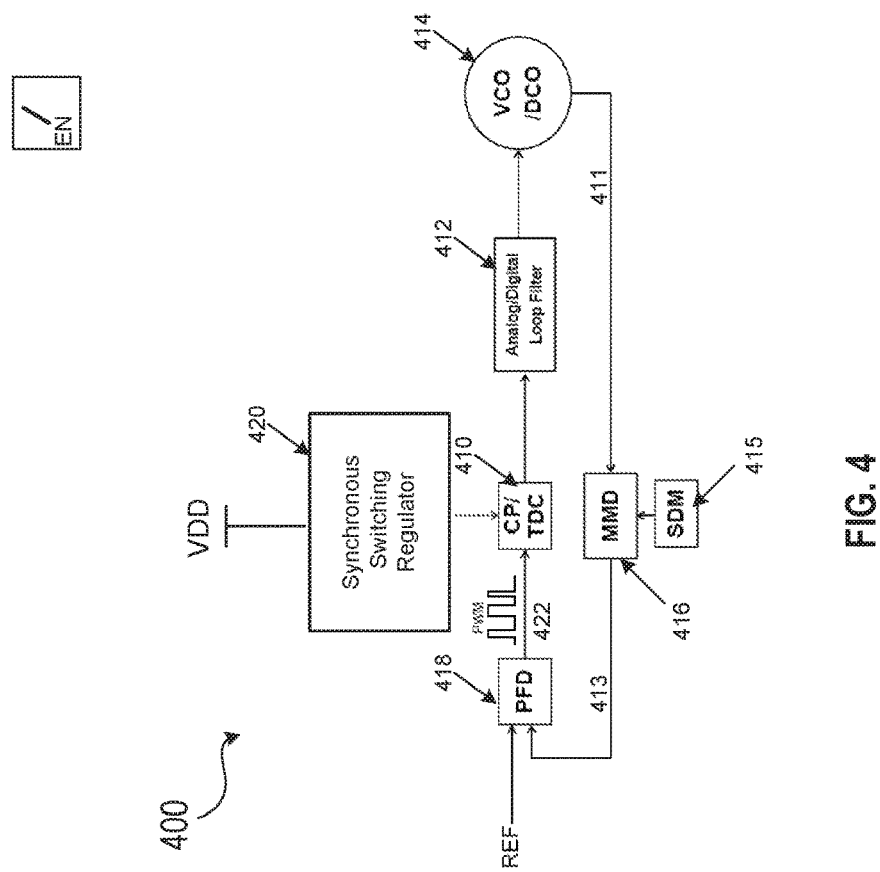
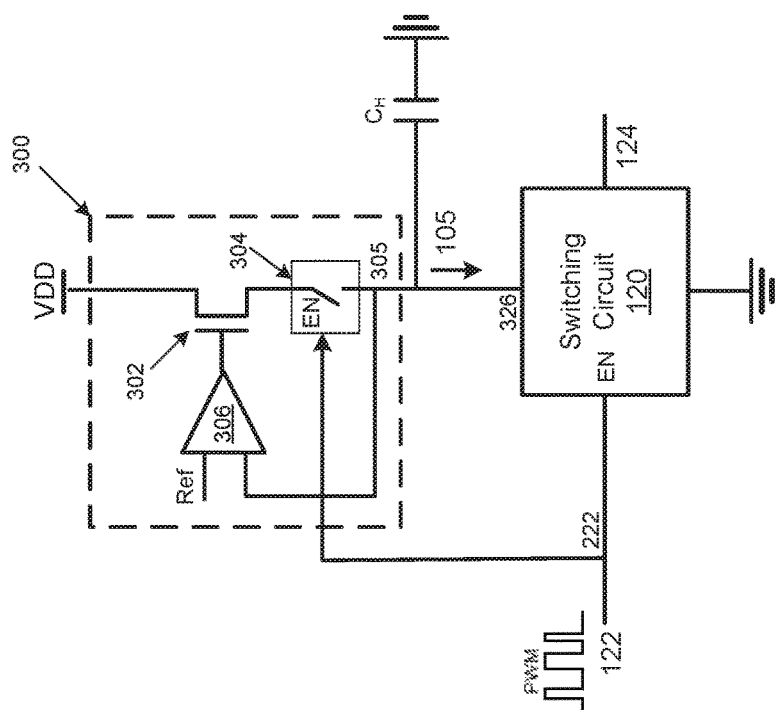
FIG. 4
FIG. 3

SYNCHRONOUS SWITCHING REGULATOR CIRCUIT

CROSS-REFERENCE TO RELATED APPLICATIONS

This application claims the benefit of priority under 35 U.S.C. § 119 from U.S. Provisional Patent Application 62/462,890 filed Feb. 23, 2017, which is incorporated herein by reference in its entirety.

TECHNICAL FIELD

The present description relates generally to integrated circuits, and more particularly, to a synchronous switching regulator for supply regulation of switching circuits.

BACKGROUND

Phased locked loops (PLLs) are commonly used in a large number of applications within the radio frequency technology. For example, PLLs can be used as frequency modulation (FM) demodulators and can form the basis of indirect frequency synthesizers. Additionally, the PLLs can be used for different types of variable frequency filters and a host of other special applications. A PLL is a control system that can generate an output signal having a phase related to the phase of the PLL input signal. There are several differing types of PLL including analog and digital PLLs, which generally include common electronic circuit blocks, such as a variable frequency oscillator and a phase detector. For both the analog PLL and digital PLL, there are blocks that generate switching current passing through a supply source. The switching current can cause supply ringing and fluctuation. On the other hand, the linearity of these blocks is very sensitive to supply voltage variation.

BRIEF DESCRIPTION OF THE DRAWINGS

Certain features of the subject technology are set forth in the appended claims. However, for purposes of explanation, several embodiments of the subject technology are set forth in the following figures.

FIG. 3 is a schematic diagram illustrating an example of a synchronous switching regulator for supply regulation of a switching circuit, according to aspects of the subject technology.

FIG. 4 is a schematic diagram illustrating an example of a phase locked loop (PLL) circuit using a synchronous switching regulator, according to aspects of the subject technology.

DETAILED DESCRIPTION

Figure 2:
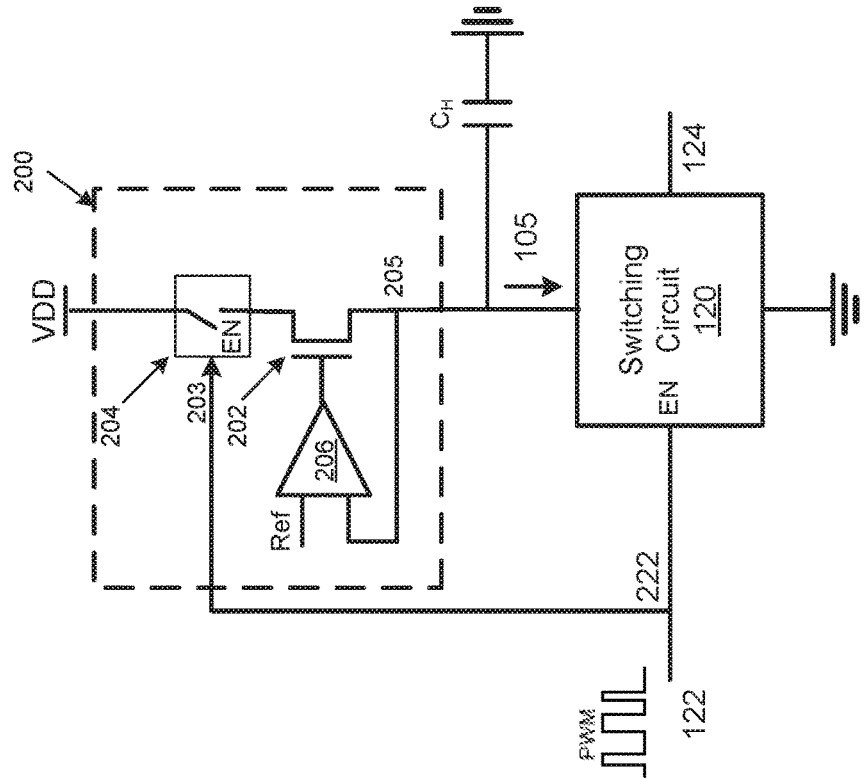
FIG. 2 is a schematic diagram illustrating an example of a synchronous switching regulator for supply regulation of a switching circuit, according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, methods and systems for providing a synchronous switching regulator for supply regulation of a switching circuit are provided. The switching regulator can be a low dropout regulator (LDO). Examples of the switching circuits include charge-pump (CP) and time-to-digital converter (TDC) circuits, which are commonly used in analog and digital phase-locked loop (PLL) circuits. In many PLL circuits a sigma-delta modulator (SDM) is used in conjunction with a multi-modulus divider (MMD) to divide a frequency of a signal from a voltage controlled oscillator (VCO) or a digitally controlled oscillator (DCO) by a desired (e.g., non-integer) number to be fed back to a phase frequency detector (PFD). The PFD can generate a pulse-width modulated (PWM) signal based on a phase difference between the signal received from the MMD and a reference signal. The PWM signal controls the switching circuit (e.g., the CP or TDC), which is powered by a voltage regulator (e.g., an LDO).

The switching circuit can draw a rather large current (e.g., tens of µA to several mA) from the voltage regulator (e.g., LDO) when the PWM signal is high, and a small current when the PWM signal is low. Such variations may cause ringing and fluctuation on the supply of switching circuit that can lead to a substantial non-linearity in the switching circuit. The non-linearity in the switching circuit can cause noise folding of the high-frequency noise of the SDM. The SDM noise folding can result in degradation of the PLL phase noise. The supply ringing of the switching circuit (e.g., CP or TDC) is conventionally reduced by using substantially large on-board capacitors (e.g., on the order of a few nanofarads), adding an on-chip damping resistor to suppress ringing from parasitic route inductance, and/or using large internal bypass capacitors. The large on-board capacitors and an on-chip damping register need to be connected with an extra switching circuit VDD ball or pin consuming a substantial area of the chip real estate. The current communication technology requires high performance, low cost and low power PLLs that can be provided by using high switching current CPs or TDCs that are more susceptible to supply bouncing.

The synchronous switching regulator of the subject technology can satisfy most requirements of the current communication technology by drastically reducing load perturbation of the switching regulator (e.g., LDO).

Figure 1:
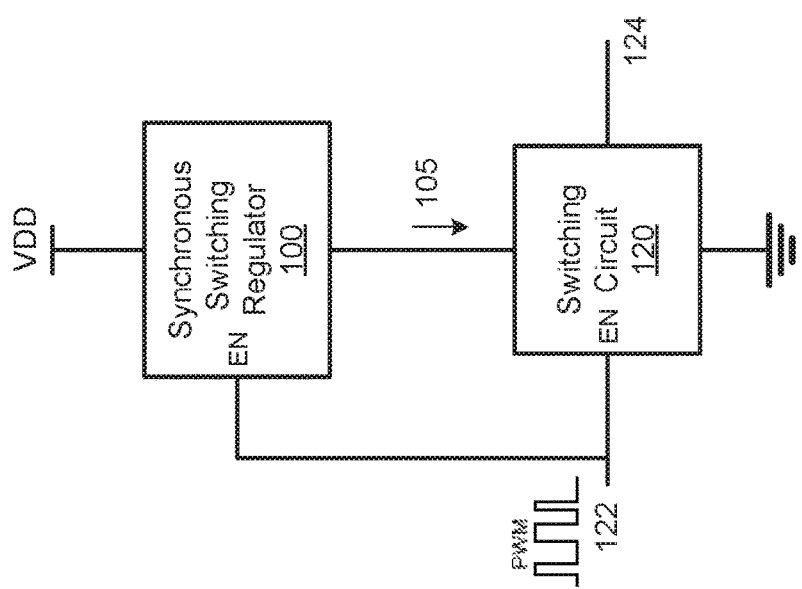
FIG. 1 is a high-level diagram illustrating an example of a synchronous switching regulator for supply regulation of a switching circuit, according to aspects of the subject technology.

FIG. 1 is a high-level diagram illustrating an example of a synchronous switching regulator 100 for supply regulation of a switching circuit 120 according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

An enable input (EN) node of the synchronous switching regulator 100 is controlled by a switching signal 122 applied to an EN node of the switching circuit 120. When the switching signal 122 is high, the synchronous switching regulator 100 and the switching circuit 120 are in an operation mode and the synchronous switching regulator 100 provides a current 105 to the switching circuit 120. Otherwise, when the switching signal 122 is low, the synchronous switching regulator 100 and the switching circuit 120 are off. The control of the synchronous switching regulator 100 by the switching signal 122 is to synchronize the synchronous switching regulator 100 with switching of the switching circuit 120. The synchronization can significantly reduce the load perturbation of the synchronous switching regulator 100 and alleviates the need for the large on-board capacitors and the on-chip damping resistors for suppression of the supply ringing. In some implementations, the switching signal 122 is a pulse-width modulated signal that controls on and off timing of the switching circuit 120. In some aspects, the switching circuit 120 can be, but is not limited to, a CP in an analog PLL or a TDC in a digital PLL.

FIG. 2 is a schematic diagram illustrating an example of a synchronous switching regulator 200 for supply regulation of a switching circuit 120, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The synchronous switching regulator 200 can supply an operating voltage to the switching circuit 120. The synchronous switching regulator 200 includes a pass transistor 202, an amplifier 206 and a switch 204. In some implementations, the pass transistor 202 can be, but is not limited to, a field-effect transistor (FET) such as metal-oxide FET (MOSFET). For example, the pass transistor 202 can be an NMOS, a PMOS or other types of transistor. The pass transistor 202 provides a current 105 to the switching circuit 120. The amplifier 206 can be, but is not limited to, an operational amplifier (Op-Amp). The amplifier 206 compares an output voltage at node 205 of the pass transistor 202 with a reference (Ref) voltage and drives the pass transistor based on the comparison result to regulate the output voltage at the node 205. The switch 204 can be, but is not limited to, a transistor such as a MOSFET. The switch 204 can control a flow of a supply current through the pass transistor 202 to the switching circuit 120 based on a switching signal 122. The switch 204 can turn a current passing through the pass transistor 202 (e.g., 105) on or off based on a voltage at a gate node 203 of the switch 204. A charge holding capacitor $C_H$ is coupled between the node 205 and the ground potential. The charge holding capacitor $C_H$ can hold charge and maintain the voltage at the node 205 and reduce voltage change at the node 205. When the switch 204 is in an on state and the switching circuit 120 is on, the charge holding capacitor $C_H$ can work as a conventional load regulation capacitor in the static LDOs. The charge holding capacitor $C_H$ has to be sufficiently large to suppress glitches from charging imbalance caused by non-ideal switching behavior such as the propagation delay mismatch of the switching signal 122 between switching circuit 120 and synchronous switching regulator 200. However, synchronous switching technique reduces significantly the required LDO bypass capacitance for supply regulation since LDO sees much smaller load perturbation in behalf of synchronous switching.

An enable (EN) node 203 of the switch 204 is coupled to an input node 222 of the switching circuit 120, which receives the switching signal 122. In some implementations, the switching signal 122 is, but is not limited to, a pulse-width modulated (PWM) signal. The switching signal 122 can turn the switching circuit 120 and simultaneously the switch 204 on or off. The synchronization between the switch 204 and the switching circuit 120 can drastically reduce the load perturbation of the synchronous switching regulator 200 and alleviates the need for the large on-board capacitors and the on-chip damping resistors for suppression of the supply ringing. In some implementations, the synchronous switching regulator 200 is a low-dropout (LDO) regulator. The switching circuit 120 can be, but is not limited to, a CP or a TDC of a PLL circuit.

FIG. 3 is a schematic diagram illustrating an example of a synchronous switching regulator 300 for supply regulation of a switching circuit 120, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The synchronous switching regulator 300 is similar to the synchronous switching regulator 200 of FIG. 2, except that the switch 304 is coupled between an output node 305 of the pass transistor 302 and a node 326 of the switching circuit 120. The pass transistor 302 and the switch 304 are similar to the pass transistor 202 and the switch 204 of FIG. 2 and perform similar functionalities. The pass transistor 302 couples the voltage supply to the switching circuit 120. The flow of the current 105 to the switching circuit 120 can be turned on or off by the switch 304 based on the switching signal 122 that controls switching of the switching circuit 120, thus enabling synchronous operation of the switch 204 and the switching circuit 120. This results in the switching circuit 120 only drawing current from the synchronous switching regulator 300 when in an on state, thereby reducing load modulation effects on the synchronous switching regulator 300 and reducing the ringing and fluctuation on the switching circuit supply (node 326).

FIG. 4 is a schematic diagram illustrating an example of a PLL circuit 400 using a synchronous switching regulator 420, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The PLL circuit 400 includes a CP (or TDC) 410, an analog (or digital) loop filter 412, a VCO (or DCO) 414, a SDM 415, a MMD 416, a PFD 418 and a synchronous switching regulator 420. In analog implementation of the PLL circuit 400, the CP 410, the analog loop filter 412 and the VCO 414 are used. However, in a digital implementation of the PLL circuit 400, the CP 410, the analog loop filter 412 and the VCO 414 are respectively replaced with a TDC, a digital loop filter and a DCO. The SDM 415 in conjunction with the MMD 416 can divide a frequency of a signal 411 from the VCO 414 by a desired (e.g., non-integer) number, for example 4.5, to provide a feedback signal 413 to the PFD 418. The PFD 418 can generate a PWM signal 422 based on a phase difference between the feedback signal 413 and a reference signal (REF). The PWM signal 422 controls the CP 410, which is powered by the synchronous voltage regulator (e.g., an LDO) 420. In some implementations, the synchronous switching regulator 420 can be similar to the synchronous switching regulator 200 of FIG. 2 or the synchronous switching regulator 300 of FIG. 3.

The CP 410 can draw a rather large current (e.g., tens of μA to several mA) from synchronous switching regulator 420 when the PWM signal 422 is high, and a small current when the PWM signal 422 is low. Such variations may cause ringing and fluctuation on the supply of the synchronous switching circuit 410 that can lead to a substantial non-linearity in the CP or TDC 410. The non-linearity in the CP or TDC 410 can cause noise folding of the high-frequency noise of the SDM 415. The SDM noise folding can result in degradation of a phase noise of the PLL circuit 400. The supply ringing of the CP or TDC 410 is conventionally reduced by using substantially large on-board capacitors, adding an on-chip damping resistor to suppress ringing from parasitic route inductance, and/or using large internal bypass capacitors along with an extra VDD pin or ball, which can consume a significant area of the chip real estate. The current communication technology requires high performance, low cost and low power PLLs that can be provided by using high switching current CPs that are more susceptible to supply bouncing. The synchronous switching regulator 420 of the subject technology can significantly reduce ringing and fluctuation on the regulated supply of CP or TDC 410, which is caused by load modulation of the synchronous switching regulator 420.

Figure 5:
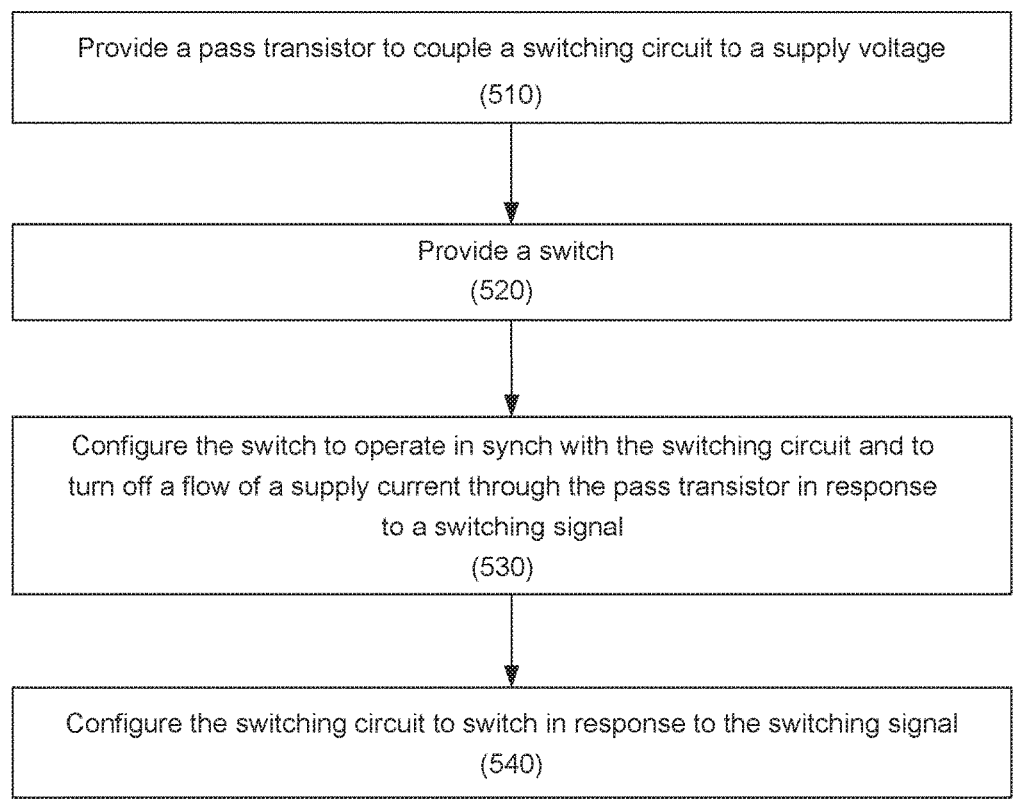
FIG. 5 is flow diagram illustrating a method of providing a synchronous switching regulator for supply regulation of a switching circuit, according to aspects of the subject technology.

FIG. 5 is flow diagram illustrating a method 500 of providing a synchronous switching regulator for supply regulation of a switching circuit, according to aspects of the subject technology. For explanatory purposes, the method 500 is primarily described herein with reference to the synchronous switching regulators 200 and 300 of FIGS. 2 and 3. However, the method 500 is not limited to the synchronous switching regulators 200 and 300 of FIGS. 2 and 3, and one or more blocks (or operations) of the method 500 may be performed by one or more other components of the synchronous switching regulators 200 and 300. Further for explanatory purposes, the blocks of the example method 500 are described herein as occurring in serial, or linearly. However, multiple blocks of the example method 500 may occur in parallel. In addition, the blocks of the example method 500 need not be performed in the order shown and/or one or more of the blocks of the example method 500 need not be performed.

The method 500 begins with providing a pass transistor (e.g., 202 of FIG. 2) to couple a switching circuit (e.g., 120 of FIG. 2) to a supply voltage (e.g., VDD of FIG. 2) (510). A switch (e.g., 204 of FIG. 2) is provided (520). The switch is configured to operate in synch with the switching circuit and to turn off a flow of a supply current (e.g., 105 of FIG. 2) through the pass transistor in response to a switching signal (e.g., 122 of FIG. 2) (530). The switching circuit is configured to switch in response to the switching signal (540).

Figure 6:
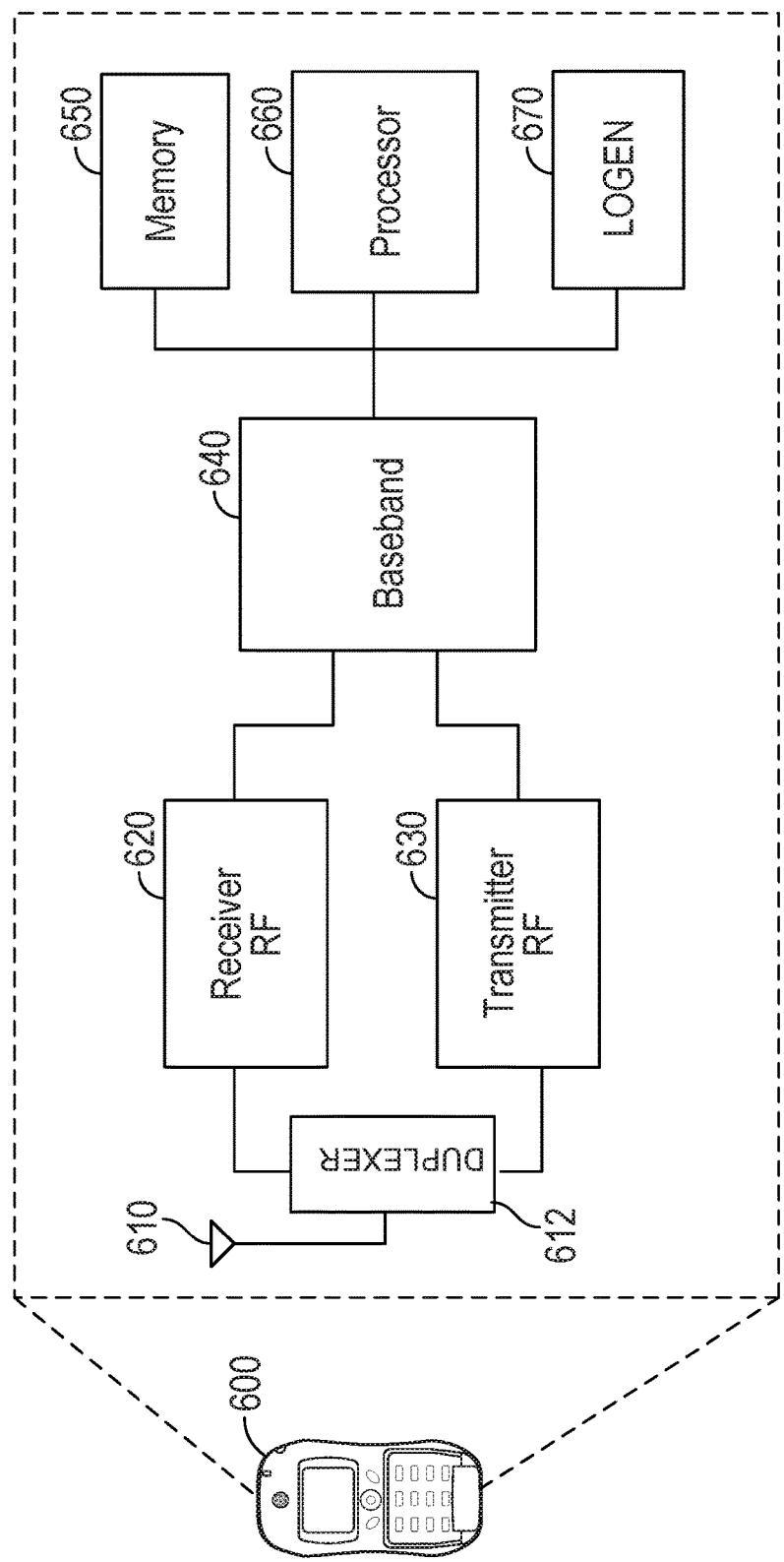
FIG. 6 is a block diagram illustrating an example wireless communication device in accordance with one or more implementations of the subject technology.

FIG. 6 is a block diagram illustrating an example wireless communication device 600 in accordance with one or more implementations of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The wireless communication device 600 may comprise a radio-frequency (RF) antenna 610, a receiver 620, a transmitter 630, a baseband processing module 640, a memory 650, a processor 660, and a local oscillator generator (LO-GEN) 670. In various embodiments of the subject technology, one or more of the blocks represented in FIG. 6 may be integrated on one or more semiconductor substrates. For example, the blocks 620-670 may be realized in a single chip or a single system on chip, or may be realized in a multi-chip chipset.

The RF antenna 610 may be suitable for transmitting and/or receiving RF signals (e.g., wireless signals) over a wide range of frequencies (e.g., 60 GHz band). Although a single RF antenna 610 is illustrated, the subject technology is not so limited.

The receiver 620 may comprise suitable logic circuitry and/or code that may be operable to receive and process signals from the RF antenna 610. The receiver 620 may, for example, be operable to amplify and/or down-convert received wireless signals. In various embodiments of the subject technology, the receiver 620 may be operable to cancel noise in received signals and may be in close proximity to over a wide range of frequencies. In this manner, the receiver 620 may be suitable for receiving signals in accordance with a variety of wireless standards. Wi-Fi, WiMAX, Bluetooth, and various cellular standards. In various embodiments of the subject technology, the receiver 620 may not require any SAW filters and few or no off-chip discrete components such as large capacitors and inductors.

The transmitter 630 may comprise suitable logic circuitry and/or code that may be operable to process and transmit signals from the RF antenna 610. The transmitter 630 may, for example, be operable to up-convert baseband signals to RF signals and amplify RF signals. In various embodiments of the subject technology, the transmitter 630 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 630 may be operable to provide signals for further amplification by one or more power amplifiers.

The duplexer 612 may provide isolation in the transmit band to avoid saturation of the receiver 620 or damaging parts of the receiver 620, and to relax one or more design requirements of the receiver 620. Furthermore, the duplexer 612 may attenuate the noise in the receive band. The duplexer may be operable in multiple frequency bands of various wireless standards.

The baseband processing module 640 may comprise suitable logic, circuitry, interfaces, and/or code that may be operable to perform processing of baseband signals. The baseband processing module 640 may, for example, analyze received signals and generate control and/or feedback signals for configuring various components of the wireless communication device 600 such as the receiver 620. The baseband processing module 640 may be operable to encode, decode, transcode, modulate, demodulate, encrypt, decrypt, scramble, descramble, and/or otherwise process data in accordance with one or more wireless standards.

The processor 660 may comprise suitable logic, circuitry, and/or code that may enable processing data and/or controlling operations of the wireless communication device 600. In this regard, the processor 660 may be enabled to provide control signals to various other portions of the wireless communication device 600. The processor 660 may also control transfers of data between various portions of the wireless communication device 600. Additionally, the processor 660 may enable implementation of an operating system or otherwise execute code to manage operations of the wireless communication device 600.

The memory 650 may comprise suitable logic, circuitry, and/or code that may enable storage of various types of information such as received data, generated data, code, and/or configuration information. The memory 650 may comprise, for example, RAM, ROM, flash, and/or magnetic storage. In various embodiment of the subject technology, Information stored in the memory 650 may be utilized for configuring the receiver 620 and/or the baseband processing module 640.

The local oscillator generator (LOGEN) 670 may comprise suitable logic, circuitry, interfaces, and/or code that may be operable to generate one or more oscillating signals of one or more frequencies. The LOGEN 670 may be operable to generate digital and/or analog signals. In this manner, the LOGEN 670 may be operable to generate one or more clock signals and/or sinusoidal signals. Characteristics of the oscillating signals such as the frequency and duty cycle may be determined based on one or more control signals from, for example, the processor 660 and/or the baseband processing module 640.

In one or more implementations, the LOGEN 670 may use a PLL (e.g., 400 of FIG. 4) that benefits from the advantageous features of the synchronous switching regulator of the subject technology (e.g., 200 of FIG. 2 or 300 of FIG. 3).

In operation, the processor 660 may configure the various components of the wireless communication device 600 based on a wireless standard according to which it is desired to receive signals. Wireless signals may be received via the RF antenna 610 and amplified and down-converted by the receiver 620. The baseband processing module 640 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 650, and/or information affecting and/or enabling operation of the wireless communication device 600. The baseband processing module 640 may modulate, encode and perform other processing on audio, video, and/or control signals to be transmitted by the transmitter 630 in accordance to various wireless standards.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A synchronous switching regulator circuit, the circuit comprising:
    a pass transistor configured to couple a switching circuit to a supply voltage; and
    a switch operable to synchronously turn off a flow of a supply current through the pass transistor,
    wherein:
    the switching circuit is configured to be controlled by a switching signal, and
    the switch is configured to be controlled by the switching signal to operate in synchronization with the switching circuit.

2. The circuit of claim 1, wherein the switching signal comprises a pulse-width modulated (PWM) signal, and the switch is configured to be controlled by the PWM signal.

3. The circuit of claim 1, wherein the switch is coupled between the pass transistor and the supply voltage.

4. The circuit of claim 1, wherein the switch is coupled between the pass transistor and the switching circuit.

5. The circuit of claim 1, wherein the switching circuit comprises one of a charge pump (CP) or a time-to-digital converter (TDC) circuit.

6. The circuit of claim 1, wherein the synchronous switching regulator circuit comprises a synchronous low dropout (LDO) switching regulator circuit.

7. The circuit of claim 1, further comprising a charge holding capacitor coupled between an output node of the synchronous switching regulator circuit connected to the switching circuit and a ground potential.

8. The circuit of claim 1, wherein the switch is operable to reduce supply ringing and fluctuation caused by load modulation of the synchronous switching regulator circuit.

9. The circuit of claim 1, further comprising an amplifier configured to drive the pass transistor and to control a current of the pass transistor based on a difference between an output voltage of the pass transistor and a reference voltage.

10. A wireless communication device, the device comprising:
a phased lock loop (PLL) including a switching circuit; and
a synchronous switching regulator configured to supply an operating voltage to the switching circuit,
wherein:
the synchronous switching regulator comprises:
a pass transistor configured to couple a voltage supply to the switching circuit; and
a switch operable to control a flow of a supply current through the pass transistor to the switching circuit based on a switching signal, wherein the switching circuit is configured to be controlled by the switching signal.

11. The device of claim 10, wherein the switch is coupled between the pass transistor and a voltage supply.

12. The device of claim 10, wherein the switch is coupled between the pass transistor and the switching circuit.

13. The device of claim 10, wherein the switching circuit comprises one of a charge pump (CP) or a time-to-digital converter (TDC) circuit.

14. The device of claim 10, wherein the switching signal comprises a pulse-width modulated (PWM) signal, and the switch is configured to be controlled by the PWM signal.

15. The device of claim 10, further comprising coupling a charge holding capacitor between an output node of the synchronous switching regulator circuit connected to the switching circuit and a ground potential.

16. The device of claim 10, wherein the switch is operable to reduce load modulation effects on synchronous switching regulator circuit and to reduce noise.

17. A method of providing a synchronous switching regulator circuit, the method comprising:
providing a pass transistor to couple a switching circuit to a supply voltage;
providing a switch;
configuring the switch to be controlled by the switching signal to operate in synchronization with the switching circuit and to turn off a flow of a supply current through the pass transistor in response to a switching signal; and
configuring the switching circuit to switch in response to the switching signal.

18. The method of claim 17, further comprising coupling the switch between the pass transistor and the supply voltage.

19. The method of claim 17, further comprising coupling the switch between the pass transistor and the switching circuit.

20. The method of claim 17, further comprising coupling a charge holding capacitor between an output node of the synchronous switching regulator circuit connected to the switching circuit and a ground potential.

* * * * *